United States Patent [19]
Liu et al.

[11] Patent Number: 5,923,063
[45] Date of Patent: Jul. 13, 1999

[54] DOUBLE DENSITY V NONVOLATILE MEMORY CELL

[75] Inventors: Yowjuang W. Liu, San Jose; Donald L. Wollesen, Saratoga; John T. Yue, Los Altos, all of Calif.

[73] Assignee: Advanced Micro Devices, Inc., Sunnyvale, Calif.

[21] Appl. No.: 09/026,358

[22] Filed: Feb. 19, 1998

[51] Int. Cl.⁶ ............... H01L 29/76; H01L 29/88; H01L 29/788; H01L 29/792

[52] U.S. Cl. ............... 257/316; 257/314; 257/321; 257/324

[58] Field of Search .................. 257/314–324; 438/257–264

[56] References Cited

U.S. PATENT DOCUMENTS

| | | | |
|---|---|---|---|
| 4,222,063 | 9/1980 | Rodgers | 357/45 |
| 4,774,556 | 9/1988 | Fujii et al. | 257/316 |
| 4,929,988 | 5/1990 | Yoshikawa | 257/316 |
| 4,996,571 | 2/1991 | Kume et al. | 357/23.5 |
| 5,227,326 | 7/1993 | Walker | 437/52 |
| 5,281,548 | 1/1994 | Prall | 437/43 |
| 5,346,835 | 9/1994 | Malhi et al. | 437/41 |
| 5,492,846 | 2/1996 | Hara | 437/43 |
| 5,563,083 | 10/1996 | Pein | 257/314 |
| 5,606,521 | 2/1997 | Kuo et al. | 365/149 |
| 5,614,430 | 3/1997 | Liang et al. | 437/45 |
| 5,616,510 | 4/1997 | Wong | 438/259 |
| 5,666,311 | 9/1997 | Mori | 438/257 |

*Primary Examiner*—Tom Thomas
*Assistant Examiner*—Cwong Quang Nguyen
*Attorney, Agent, or Firm*—Jefferson Perkins

[57] ABSTRACT

Floating gates of nonvolatile memory cells are formed in pairs within a pyramidal or truncated pyramidal opening in a semiconductor layer between a top surface thereof and a heavily doped source region spaced from the surface of the semiconductor layer. The floating gates control the conductance of channel regions formed along the sloped sidewalls of the pyramidal openings between surface drains and the buried source region.

26 Claims, 10 Drawing Sheets

DOUBLE DENSITY V NONVOLATILE MEMORY CELL

RELATED APPLICATIONS

This application is related to copending Application Ser. No. 08/826,558 filed Apr. 4, 1997, invented by the inventors hereof and assigned to the assignee hereof.

TECHNICAL FIELD OF THE INVENTION

The present invention relates to electrically programmable read-only memory cells (EPROMs) and electrically erasable and programmable read-only memory cells (EEPROMs), and "flash" EPROMs, and more particularly to a plurality of EPROM/flash EPROM/EEPROM cells having respective floating gates formed in a hole of a semiconductor layer.

BACKGROUND OF THE INVENTION

In the semiconductor processing art, practitioners always seek to achieve structures having a minimum size in order to save real estate. With respect to EEPROM, flash EPROM and EPROM cells, a critical limitation has been found to be a channel length between a drain region and a source region of the cell, the conductance of this channel being controlled by a floating gate. Ways have therefore been sought to decouple lithographic constraints from the channel length while at the same time retaining control over the critical channel length and producing a reliable device. In Applicants' copending Ser. No. 08/826,558 filed Apr. 4, 1997, the Applicants disclosed the formation of pyramidal-shaped holes, or truncated versions of same, in a semiconductor layer such that the sidewalls of the holes were disposed at a substantial angle to the face of the semiconductor layer. A tunnel dielectric layer was formed on the sidewalls and the hole then filled with a conductive floating gate. The semiconductor layer was previously implanted so that a source region was spaced away from the semiconductor face, and so that a drain region was disposed adjacent the face; a channel region of opposite conductivity type to the foregoing spaced apart the source and drain regions and was disposed adjacent at least one, and preferably all four, sidewalls. The partially vertical disposition of the channel region allowed its dimension to be decoupled from lithographic constrains. But further improvements can be made in array compactness.

SUMMARY OF THE INVENTION

According to one aspect of the present invention, there is provided a pair of nonvolatile memory cells, such as electrically erasable and programmable memory (EEPROM) cells, electrically programmable read-only memory (EPROM) cells, or "flash" EPROM cells, that are formed at a face of a semiconductor layer having a first conductivity type, such as (p). A heavily doped region is formed in this layer to have a second conductivity type (such as (n)) opposite the first conductivity type, and having a boundary spaced from the face of the semiconductor layer. A hole, which may take the form of an inverted, elongated and truncated pyramid, is formed in the semiconductor layer to extend downward from the face thereof and to intersect the heavily doped region. A tunnel dielectric layer is formed on the sidewalls of the hole. A conductive floating gate body is formed within the hole to adjoin the tunnel dielectric layer and to be insulatively spaced from the semiconductor layer. One or more floating gate insulator layers are formed on the top surface of the conductor floating gate body, and a conductive control gate body is formed on top of this. The control gate bodies are used to self-align a drain region of the second conductivity type, the drain region being formed on the surface of the semiconductor layer so as to be spaced from the heavily doped region below it. The control gate body and the floating gate body are then separated into a plurality of control gates and floating gates as by etching a trench to bisect the hole. This produces first and second control gate and floating gate structures which are electrical insulated from each other and preferably substantially capacitively decoupled from each other.

A principal technical advantage of the invention is conferred by the formation of a channel not on the surface of semiconductor layer, but rather along the whole sidewall between the drain region and the heavily doped region, which acts as a source region. In this way, the length of the channel is a function of the depth of the hole rather than a lithographic constraint. Because of this, the channel length may be made relatively large without requiring a commensurate expansion in the size of the nonvolatile memory cell. Preferably, the hole has sidewalls that are sloped at a substantial angle from the horizontal; even more preferably, opposing sidewalls of this hole or trench are V-shaped, with the hole having a flat bottom, and the sidewalls are formed at an angle of approximately 54.7° to the surface of the semiconductor layer, which is grown such that its horizontal surface is of 1-0-0 crystallography, by an orientation-dependent etch. A further technical advantage is conferred by placing at least two, and possibly more, floating gates in the same hole, thereby saving real estate.

The structure of the nonvolatile cells according to the invention is conducive to its placement in an array of such cells, and to the cells' isolation by oxide trenches.

BRIEF DESCRIPTION OF THE DRAWINGS

Further aspects of the invention and their advantages will be discerned by reading the following detailed description in conjunction with the drawings, in which like characters identify like parts and in which.

DETAILED DESCRIPTION OF THE INVENTION

Figure 8A:
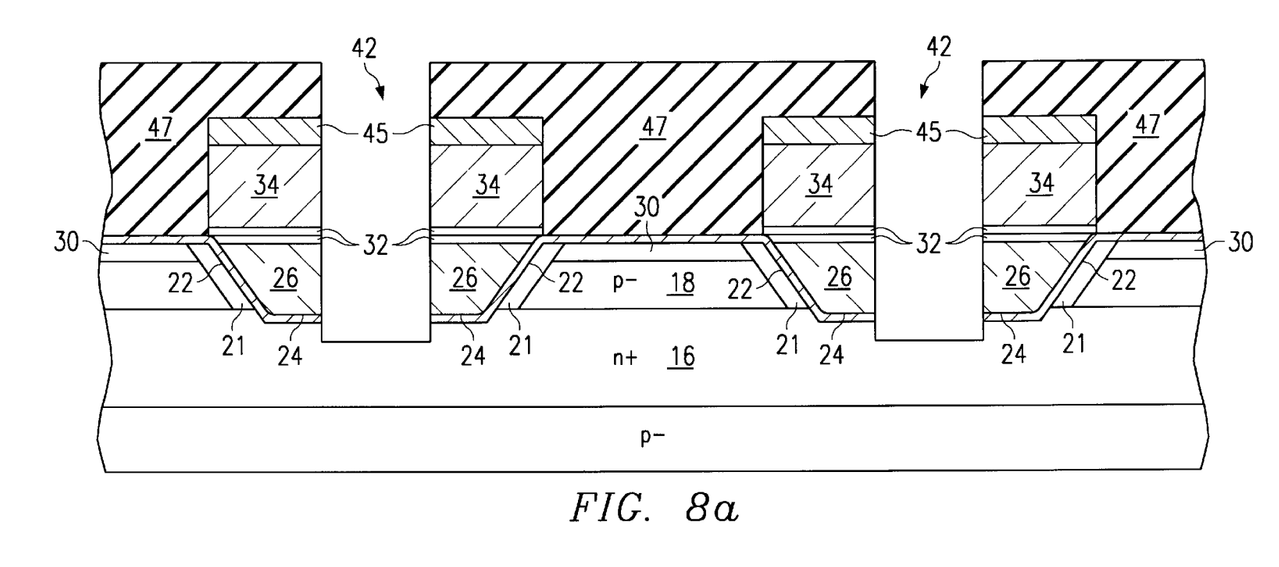
FIG. 8a is a highly magnified schematic cross-sectional view taken substantially along line I—I of FIG. 1, illustrating a seventh stage of fabrication of the device.
Figure 8B:
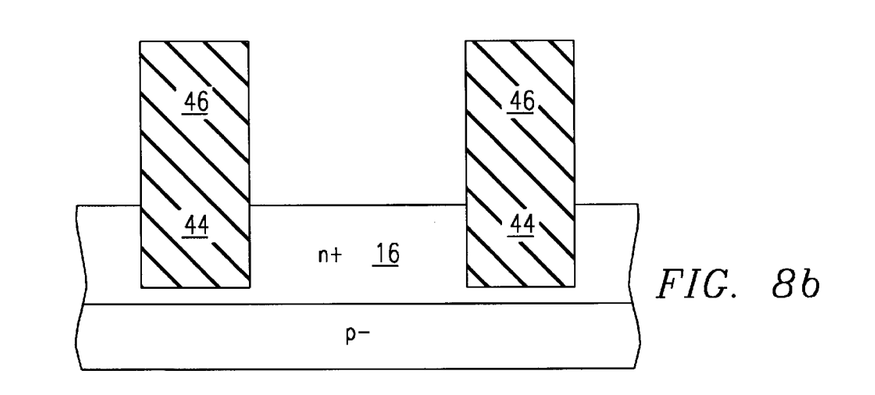
FIG. 8b is a highly magnified schematic cross-sectional view taken substantially along line II—II of FIG. 1, illustrating a seventh stage of fabrication of the device.
Figure 9A:
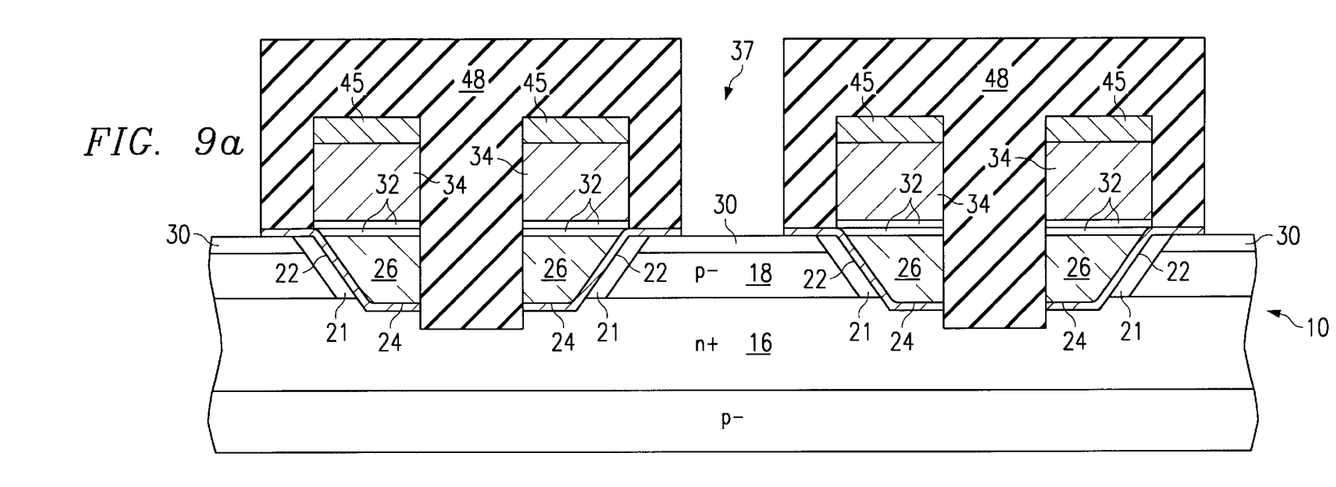
FIG. 9a is a highly magnified schematic cross-sectional view taken substantially along line I—I of FIG. 1, illustrating a substantially completed array.
Figure 9B:
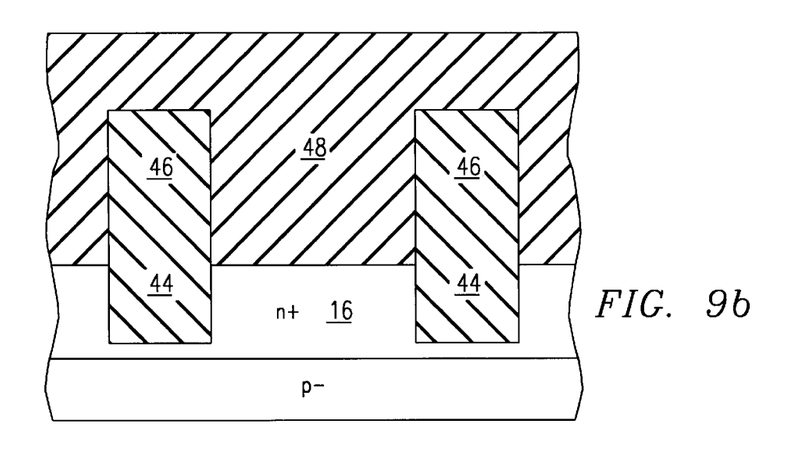
FIG. 9b is a highly magnified schematic cross-sectional view taken substantially along line II—II of FIG. 1, illustrating an essentially completed array.
Figure 10:
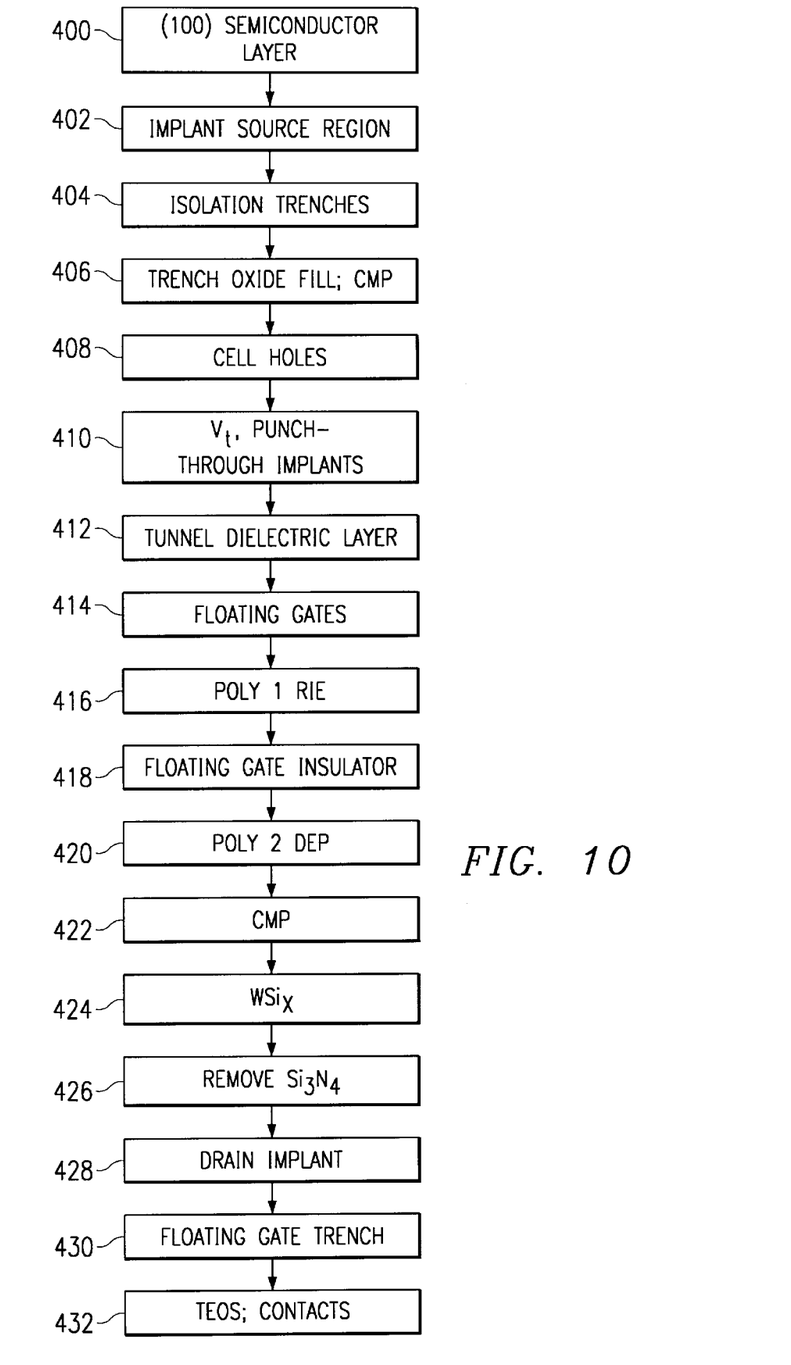
FIG. 10 is a flow diagram illustrating a process for fabricating the invention.

Referring to FIGS. 1–9b for structural details and FIG. 10 for process steps, an array of EEPROM cells formed according to the invention is indicated generally at 10. To build the array 10, and with reference to FIGS. 2a and 2b, a semiconductor substrate or a semiconductor-on-insulator (SOI) layer 12 is provided such that a top surface 13 thereof will have a [100] crystallographic orientation. The semiconductor substrate 12 is preferably silicon. The provision of this [100] layer is shown at 400 in FIG. 10.

At step 402, a deep and relatively high-energy implant of an (n) type dopant is implanted into the layer 12 (first seen in FIGS. 2a and 2b) in order to create a highly doped region 16. For example, the implant can be arsenic, antimony or phosphorus and can be administered at a dose of $10^{13}$ to $10^{16}$ ions/cm$^2$ and an implantation energy of 100 to 1000 KeV. Preferably, region 16 is created with a double implant of two (n) dopants, such as arsenic and phosphorus. The implantation(s) may be followed by a diffusion drive-in step. The creation of the highly doped region 16 defines a lightly doped region 18 adjacent the upper boundary 19 of the heavily doped region 16. The region 18 should be of a conductivity type opposite that of the heavily doped region 16; where the heavily doped region 16 is chosen as (n) type, region 18 should be (p). The dopant concentration of the region 18 should be chosen such that a relatively lightly doped (p−) material results. For example, the dopant used to form layer 12, and therefore region 18, can be boron, present at a concentration of $1\times10^{15}$ ions/cm$^3$. The dopant can be introduced into the region 18 by an implantation at a dose of $1\times10^{11}$ to $1\times10^{14}$ ions/cm$^2$ at an energy of 25 to 200 KeV. Next a layer 17 of oxide is grown on surface 13, and a silicon nitride hard mask 23 is deposited on top of layer 17.

Figure 1:
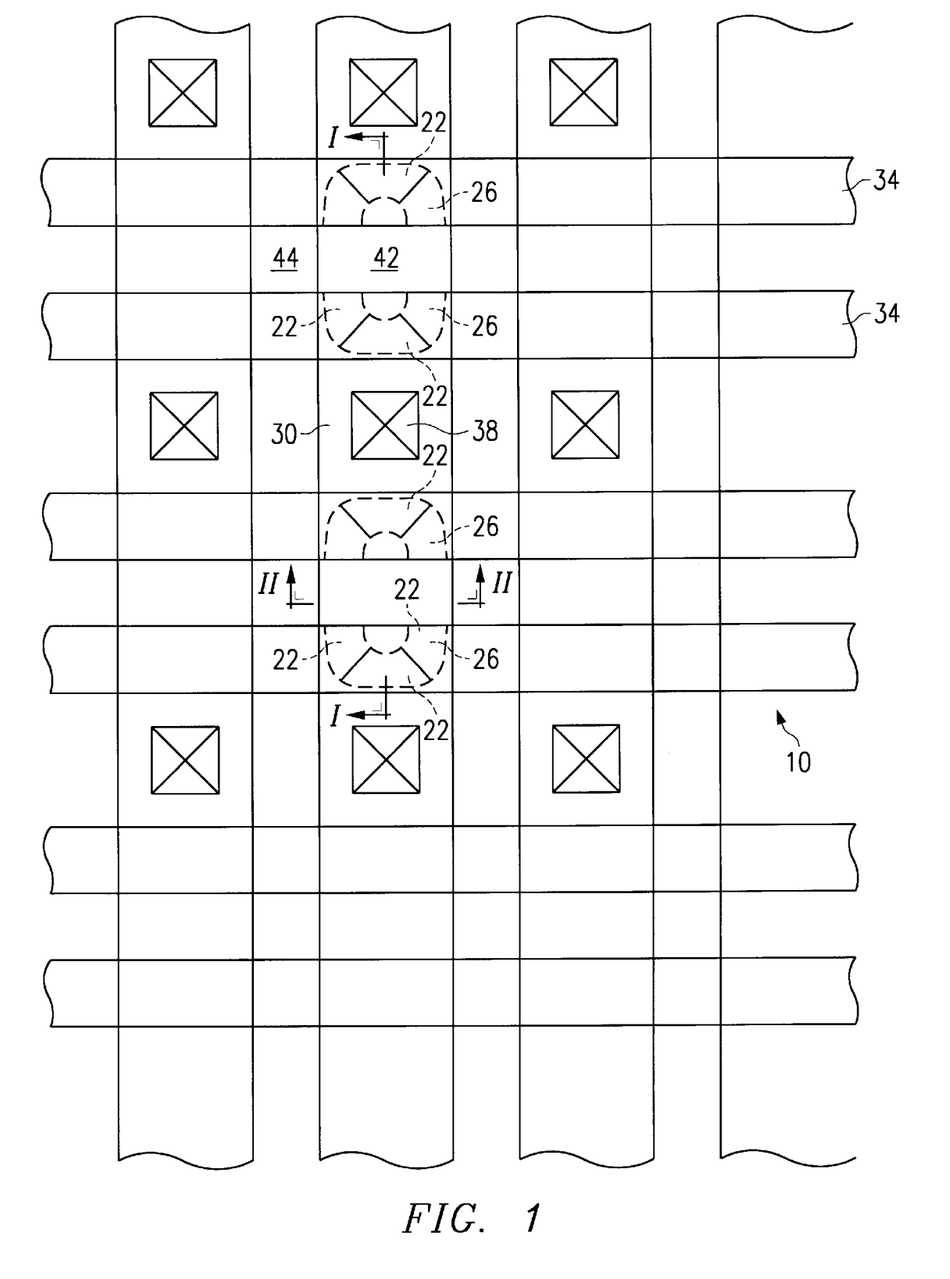
FIG. 1 is a highly magnified schematic top view of an array of nonvolatile memory cells according to the invention, certain structures being shown in phantom.
Figure 2A:
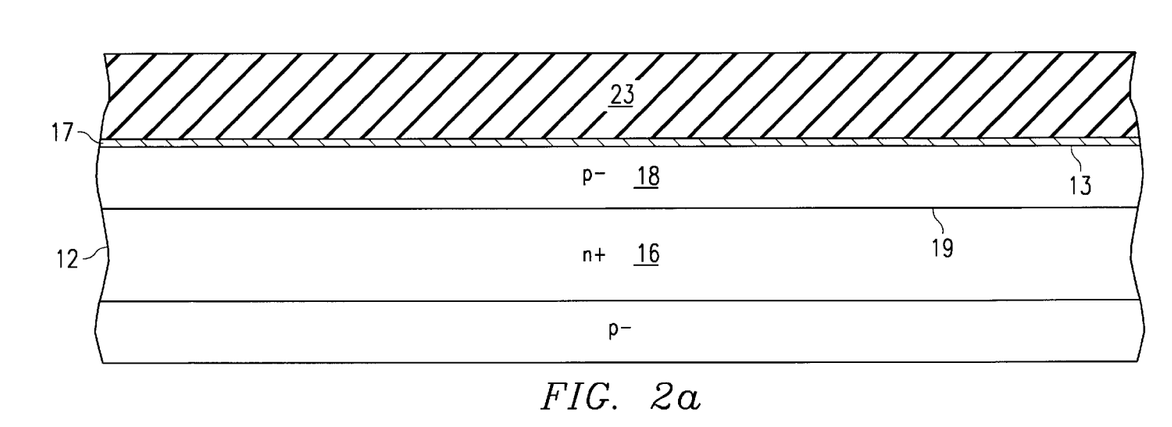
FIG. 2a is a highly magnified schematic cross-sectional view taken substantially along line I—I of FIG. 1, illustrating a first stage in fabrication.
Figure 2B:
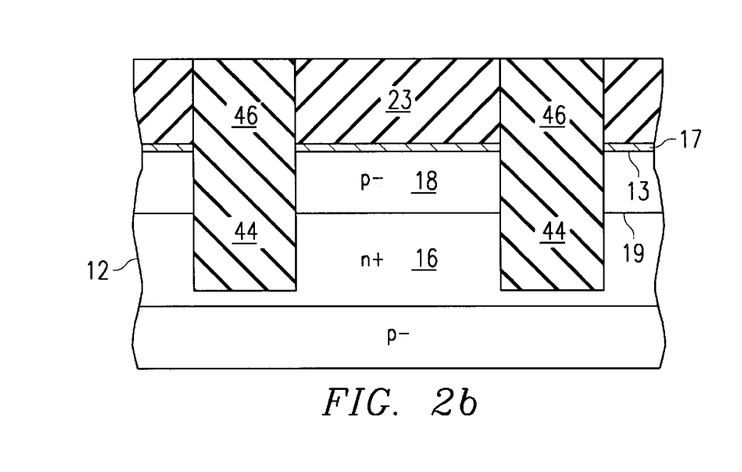
FIG. 2b is a highly magnified schematic cross-sectional view taken substantially along line II—II of FIG. 1, showing the first stage of fabrication.

The nitride layer 23 is then patterned and etched to create an isolation trench mask. At step 404 cell isolation trenches 44 may be excavated into the semiconductor layer 12 and the trenches filled (step 406) with a dielectric material 46 such as oxide. As is best seen in FIG. 1, the initial trench isolation is defined such that each of a quartet of cells in the array is laterally isolated on all sides by oxide-filled trenches. The trenches 44 should be deep enough to extend well into the heavily doped region 16 in order to provide adequate isolation between channel regions of adjacent cell groups. After oxide fill the wafer is subjected to chemical-mechanical polishing (CMP) to present a planar top surface and separate the oxide trenches from each other.

In an alternative embodiment, interdevice isolation may be accomplished by a localized oxidation of silicon (LOCOS) process instead of trench isolation. The LOCOS isolation step may take place immediately after the creation of the layer 12. In a further embodiment (not shown), the LOCOS oxidation step may be preceded by a (p)-type channel stop implant which would extend from the bottom of LOCOS oxide islands into the (n+) highly doped region 16.

Figure 3A:
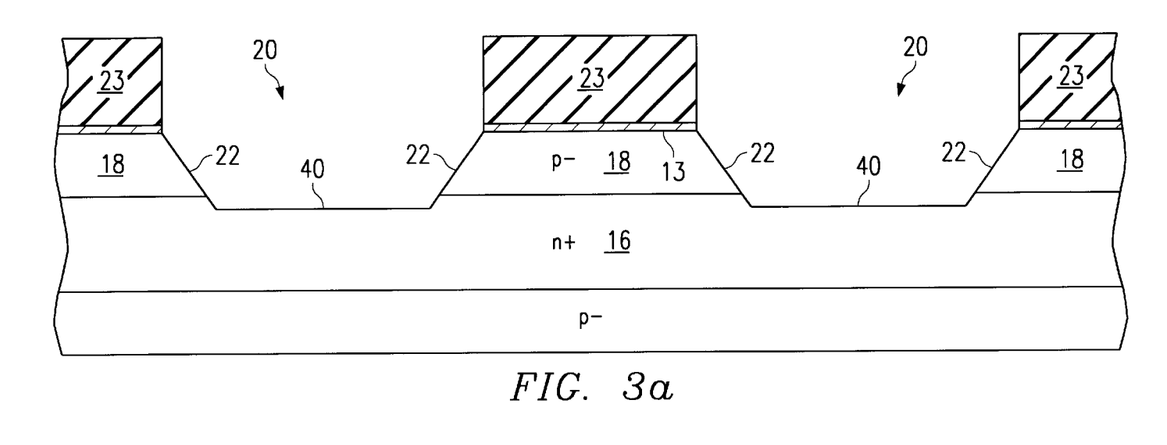
FIG. 3a is a highly magnified schematic cross-sectional view taken substantially along line I—I of FIG. 1, showing the second stage of fabrication.
Figure 3B:
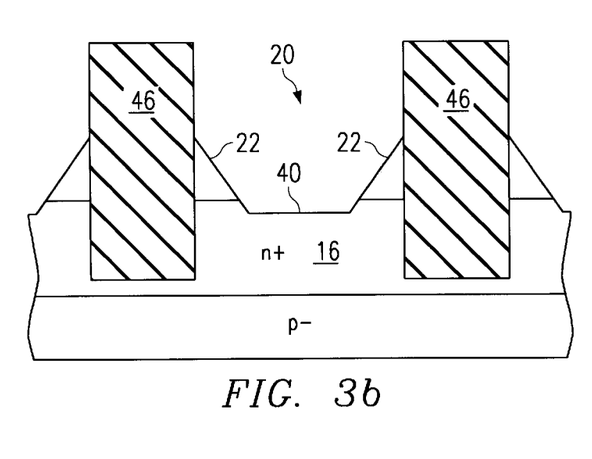
FIG. 3b is a highly magnified schematic cross-sectional view taken substantially along line II—II of FIG. 1, showing the second stage of fabrication.

FIGS. 3a and 3b show a further patterning and etching of nitride mask 23 to define windows in which will be fabricated floating gates as will be described below.

Within each island or mesa of semiconductor material left by the oxide trench isolation and fill, two elongated and sloped trenches or holes 20 are formed at step 408 to extend from the top surface 13 of the lightly doped region 18, slightly into the heavily doped region 16. In the embodiment shown in FIGS. 1–9b, these trenches or holes are truncatedly V-shaped (when considered in transverse section), or in the form of elongated, truncated pyramids, and are formed through an orientation-dependent etch. An orientation-dependent etch is then conducted using, for example, potassium hydroxide. This etch creates sidewalls 22 that slope downwardly at an angle of 54.7° to the horizontal, creating a series of inverted elongated pyramidal structures extending downwardly from nitride mask windows. In this embodiment, the inverted pyramidal trenches or holes 20 are formed with a timed etch such that the V-shaped sidewalls 22 do not meet at the bottom. Instead, the etch is terminated such that flat bottoms 40 are formed at the bottom of trenches 20. The thickness of the (p−) layer 18 and the width of the windows in which the etch is performed should be selected such that appropriate truncated pyramidal depressions are formed. FIGS. 3a and 3b illustrate the wafer structure after step 408 (cell holes; FIG. 10) has been accomplished.

In an alternative embodiment (not shown), the potassium hydroxide etch is allowed to continue until the sloping hole sidewalls meet at the center; such an embodiment would create longer channel regions but possibly create a gate insulator integrity problems at the sharp ridgeline at the hole bottoms.

The regions of layer 18 adjacent the sidewalls 22 will form channel regions in the completed nonvolatile memory cell. At step 410, and as illustrated in FIGS. 4a and 4b, these channel regions 21 may be implanted with appropriate threshold adjust and/or punch-through prevention implants through the sidewalls of the holes 20, possibly through a sacrificial oxide layer (not shown) that is removed afterward, to create channel regions 21 that are disposed adjacent the sidewalls 22.

Figure 4A:
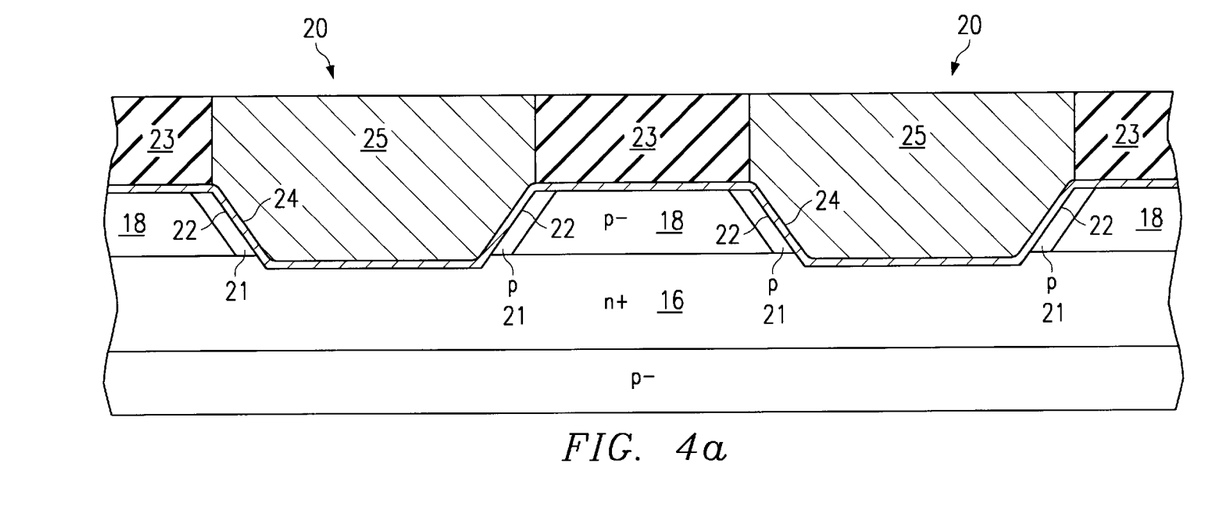
FIG. 4a is a highly magnified schematic cross-sectional view taken substantially along line I—I of FIG. 1, illustrating a third stage of fabrication of the device.
Figure 4B:
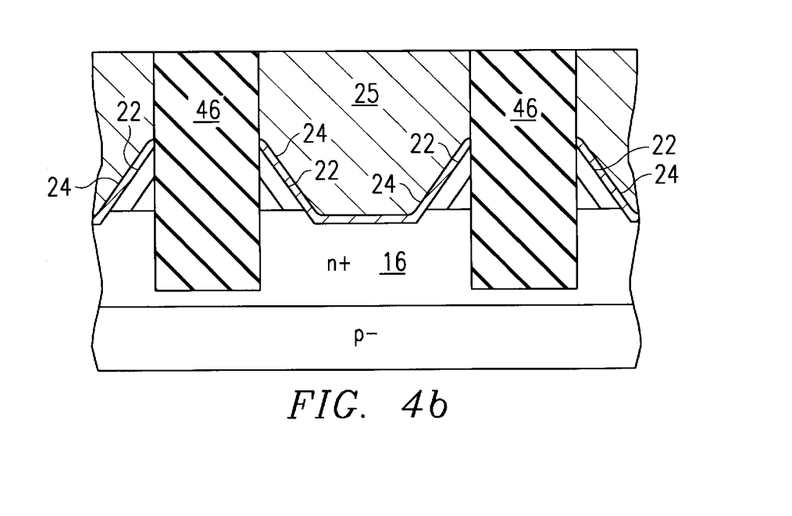
FIG. 4b is a highly magnified schematic cross-sectional view taken substantially along line II—II of FIG. 1, illustrating a third stage in fabrication of the device.

Next, at step 412 in FIG. 10 and as illustrated in FIGS. 4a and 4b, a thin tunnel oxide layer 24 (first seen in FIGS. 4a and 4b), or alternatively a nitrided oxide or an oxide-nitride-oxide tunnel dielectric for enhanced integrity, is grown on the sidewalls 22 and the bottoms 40, to create a series of U-shaped or concavely curved depressions. The curved surfaces produce less stress at the corners of tunnel insulator 24. This is followed, at step 414, by the deposition of a first layer of highly doped conductive polycrystalline silicon (poly) to create floating gate bodies 25. The poly may be doped with POCl$_3$ or by implants. As deposited, the poly will cover the entirety of surface 13. Surface 13 may be polished flat as by chemical-mechanical polishing, stopping on the nitride mask 23, in order to remove the excess poly.

Figure 5A:
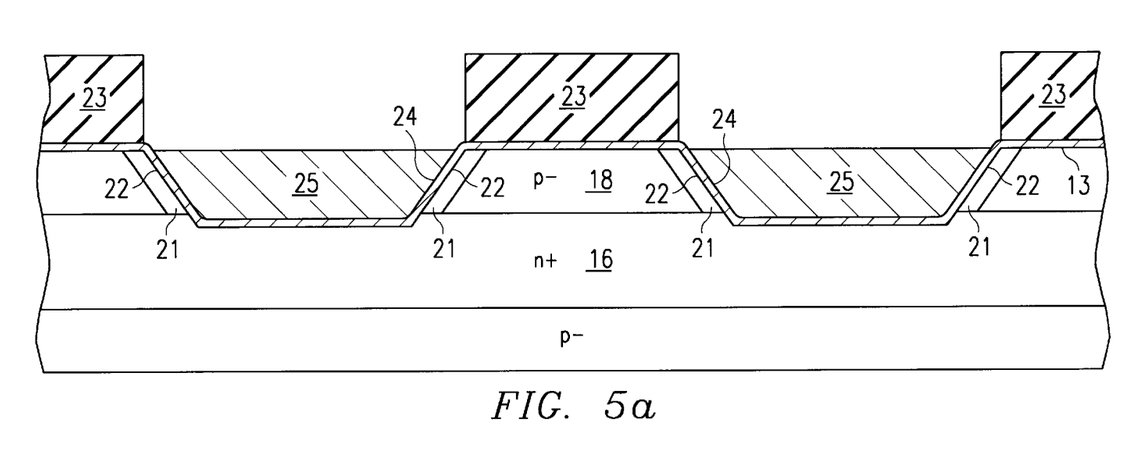
FIG. 5a is a highly magnified schematic cross-sectional view taken substantially along line I—I of FIG. 1, illustrating a fourth stage in fabrication of the device.
Figure 5B:
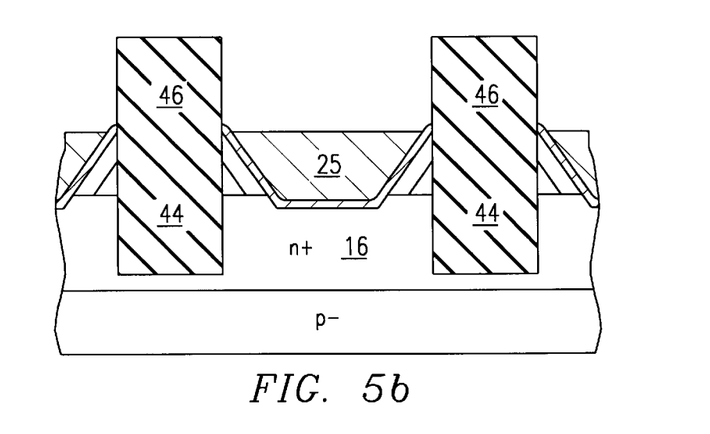
FIG. 5b is a highly magnified schematic cross-sectional view taken substantially along line II—II of FIG. 1, illustrating the fourth stage of fabrication of the device.

FIGS. 5a and 5b illustrate the next step, in which a reactive ion etch (RIE) (step 416 in FIG. 10) is performed through the nitride mask to etch away the floating gate bodies 25 down to a horizon substantially equivalent to original surface 13.

Figure 6A:
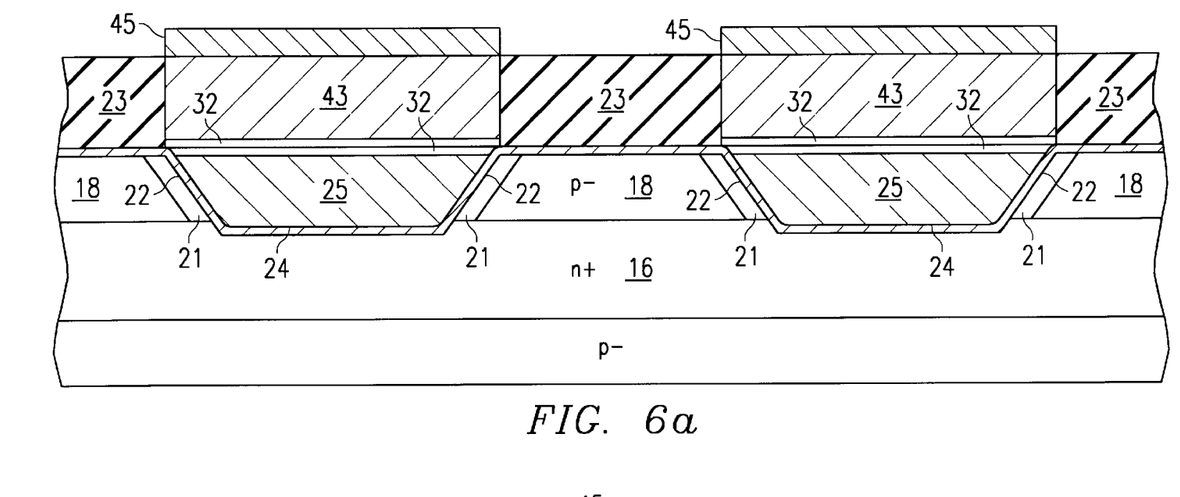
FIG. 6a is a highly magnified schematic cross-sectional view taken substantially along line I—I of FIG. 1, illustrating a fifth stage of fabrication of the device.
Figure 6B:
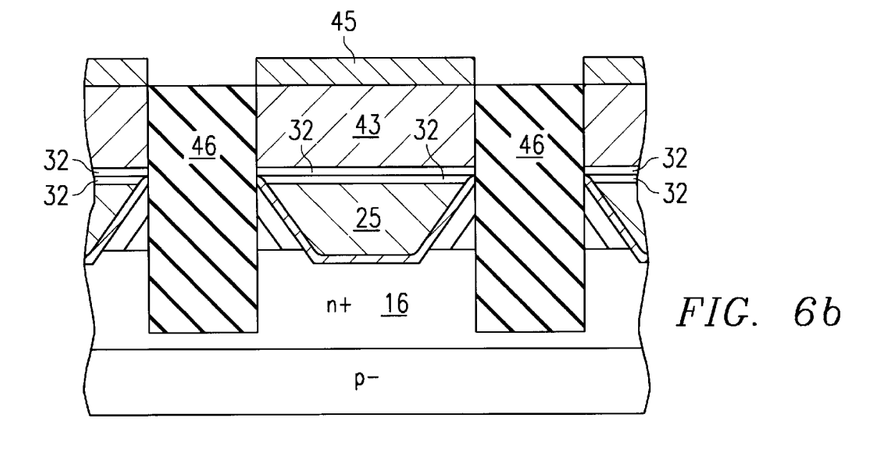
FIG. 6b is a highly magnified schematic cross-sectional view taken substantially along line II—11 of FIG. 1, illustrating a fifth stage of fabrication of the device.

Referring next to FIGS. 6a and 6b, at least one, and preferably at least two, gate insulator layers 32 are formed on the exposed surfaces of the floating gate bodies 25; this is illustrated at step 418 in FIG. 10. Layer 32 may consist of a single oxide layer, a double layer of oxide and then nitride as shown, or even an oxide-nitride-oxide sandwich for enhanced integrity.

After this point a second (poly 2) layer of polycrystalline silicon is deposited in the remaining volumes of holes 20 (FIG. 10 step 420), and a CMP step (422) is performed to remove the excess above nitride mask 23. This creates control gate bodies 43. Next, ionic tungsten is contacted (step 424) to the upper surfaces of the control gate bodies to create respective tungsten silicide (WSI$_X$) layers 45. The thickness of the WSI$_X$ layers 45 will depend on the targeted sheet resistance of the control gate bodies on which they are grown, with more WSI$_X$ causing a reduction in sheet resistance. Optionally, one or more dielectric layers (not shown) may be deposited on top of the tungsten film as a hard masking and/or protection material.

Figure 7A:
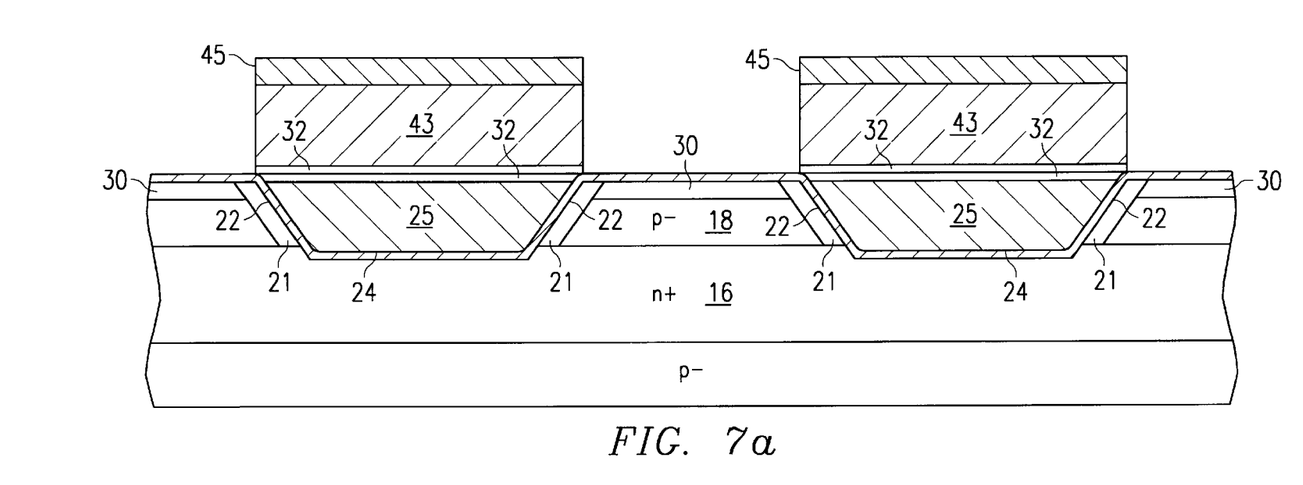
FIG. 7a is a highly magnified schematic cross-sectional view taken substantially along line I—I of FIG. 1, illustrating a sixth stage of fabrication of the device.
Figure 7B:
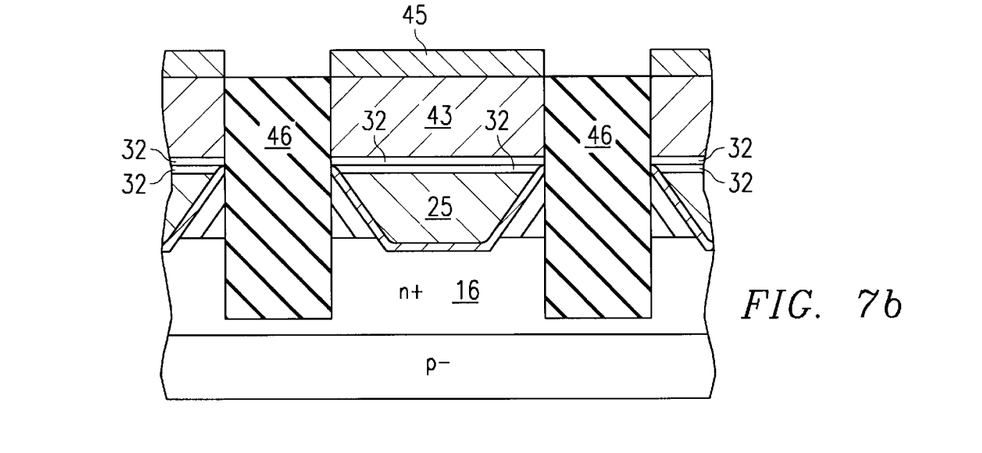
FIG. 7b is a highly magnified schematic cross-sectional view taken substantially along line II—II of FIG. 1, illustrating a sixth stage of fabrication of the device.

As shown in FIGS. 7a and 7b, the nitride mask is removed (step 426 in FIG. 10) and an implant of (n) type material is performed to create highly doped (n+) drain regions 30 (step 428 in FIG. 10).

This implant can, for example, be performed with arsenic at $5 \times 10^{15} cm^{-2}$ at an energy of approximately 30 KeV. The drain implant can then be annealed at 900° C. Pairs of the cells have drain regions which are continuous with each other, and which share a common drain contact 38.

Next, to begin step 430 (FIG. 10) and as shown in FIGS. 8a and 8b, a layer 47 of photoresist is applied to the surface of the wafer and patterned to create windows (not shown) for a floating gate etch-out step. During this step, trenches 42 are etched into each of the conductive control gate bodies 43 and floating gate bodies 25 to divide the conductive material into separate pairs of control gates 34 and floating gates 26. The floating gates 26 occupy positions which are insulatively adjacent opposed sidewalls; as seen in FIGS. 1 and 8a, one of a pair of floating gates 26 occupies a space adjacent to a left (as seen in FIGS. 1 and 8a) sidewall 22, while the other gate 26 of the pair occupies a space adjacent to the right sidewall 22. Thus, each floating gate 26 will have the benefit of being adjacent three sloping sidewalls 22, permitting a large channel width. In alternative embodiments (not shown), the etch divides each floating gate body 25 into a larger number of floating gates, such as four; this would create an "x" trench in plan view, and the four floating gates that would each be adjacent a respective sloped sidewall 22.

As illustrated, the cell floating gate trench should be wide enough to reduce the capacitive coupling of one floating gate and control gate with their twins, to forestall any problems of programming bleedover—that is, the capacitive coupling between floating gates resident in the same hole should not be so large that when one floating gate is programmed, the other one is completely or partly programmed also. The thickness of the trench 42, and therefore of the dielectric insulator later filling it, should be much greater than the thickness of the insulator layer(s) between the floating gates and the control gates. To assure a minimum of capacitive coupling, and as best seen in FIGS. 1 and 8a, in the illustrated embodiment the holes 20 have been elongated, so as to create separated floating gate pairs 26, which nonetheless define a large effective channel width along the hole sidewalls, while being separated by a trench 42 that minimizes capacitive coupling between the pairs. Another consideration driving the elongation of the holes 20 is minimum feature size; if the floating gate pair isolating trench 42 is of the minimum resolvable lithographic dimension L, then the hole will necessarily be longer than this to afford room for the floating gates. In the illustrated embodiment, a length of each floating gate in the long direction of the hole 20 is likewise made to be L, so as to match the width of the overlying control gate. In alternative embodiments, in which channel width may be sacrificed, the floating gate length may be smaller than L, as the hole containing the floating gates 26 need be only larger than the trench width, and the amount by which the trench width is exceeded can be selected by the designer to comport with requirements other than lithographic resolution of the floating gates themselves.

After the floating gate-defining trenches 42 are defined, at step 432 in FIG. 10 they are filled with a dielectric material. This is illustrated in FIGS. 9a and 9b. This may be, for example, silicon dioxide as deposited in a TEOS process. To further reduce capacitive coupling, the trenches 42 may be filled with another low-K dielectric material such as fluorine-doped SiO$_2$.

Contact holes 37 opened through the TEOS layer 48 and any insulating layers created at this location during the floating gate insulator formation process, to the drains 30. Metal or polysilicon contacts 38 (FIG. 1) are connected to a metal bit line (not shown), which bit line is insulatively spaced above control gates 34. Contacts 38 are formed to complete the structure.

As best seen in FIG. 1, each control gate or word line 34 is continuous over a row of adjacent cells. Drain region contacts 38 may be connected by metallization to a bit line (not shown) to columns of cells that are laterally perpendicular to the rows, with each cell being a member of both a column and a row.

The illustrated cell can also be formed of semiconductor regions of opposite conductivity type from those shown, i.e., the drains 30 (FIGS. 2–3) and source 16 can be (p+) while the channel region can be (n–).

In an alternative embodiment (not shown), the drains 30 may be so laterally delimited that they will completely surround the holes 20, but rather will only surround one or more sides of those holes. This would increase effective channel region cross-sectional area and therefore the performance of the cell, but would occupy more wafer real estate.

In a further alternative embodiment, the designation of the source and drain layers may be inverted. In this embodiment (not shown), the drains 30 in FIGS. 1 and 9a become source regions, and the source region 16 becomes a common drain region.

The illustrated embodiment of the present invention forms a EEPROM cell by the cooperation of a drain 30, a word line 34, an adjacent floating gate 26 and the heavily doped source region 16. One writes to the cell by placing the source region 16 (to which an off-array conductive connection is made, not shown) at ground, a high voltage such as ten volts on control gate 34, and a low voltage such as 3 volts on drain 30. This causes the migration of electrons from the source region 16 into the floating gate 26.

To read the cell, about 5 volts or VCC is impressed on the selected control gate 34, the heavily doped region 16 is held at ground, and the selected drain 30 has about one volt impressed on it. A conductive n-channel will form across the channel region 21 between the drain 30 of the selected cell and the source region 16 along the faces of sloping sidewalls 22, in the instance that floating gate 26 is charged, and the cell (if a EEPROM cell) will be read as containing a logic "1". Where a floating gate 26 contains insufficient charge, no channel will be formed between the selected drain 30 and the buried layer 16, and the cell (if a EEPROM cell) will be said to hold a logic "0". If the cell is an EPROM cell, the opposite logic convention is used: a charged state is read as "0" and a discharged state is read as "1".

The cell may be erased in bulk by applying a high voltage to the source region 16, depleting electrons from the floating gates 26. In an alternative embodiment (not shown), the cells may be selectively erased by putting the source region 16 in completely separated islands or tubs instead of a source region which is coextensive with the array as shown in the illustrated embodiment. The array's erasure can be enhanced by turning on both the drains 30 and the source region 16. A surface source voltage can also be tied to the drain bias to program the cell.

While most of the foregoing detailed description has been of a EEPROM cell and an array of such cells, the present invention applies equally to flash EPROM cells and EPROM cells.

One technical advantage of the present invention is that it saves real estate in forming the array. Where each floating gate mask window is one minimum lithographic feature wide, a channel region that is less than one feature wide in a horizontal direction may be formed. Each channel region is formed at an angle to the surface, and thus an amount of real estate is saved that is directly proportional to the cosine of 54.7°, the angle of the sidewall to the horizontal. A surface VSS connection, required in conventional arrays, is moved off-array. The channel length may be tightly controlled by controlling the depth of the layer 18 and the timing of the etch creating the gate trenches or holes. An erasure at a relatively low voltage is now possible because of the close proximity of the floating gate 26 to the source region 16. Further, a bulk erase is possible.

Another and more important technical advantage is the higher current drive achieved by the device. This is due to its wider effective channel width and shorter channel length. This improves the speed of read and write operations. A conventional cell having the same current drive would have to have a much bigger cell size.

A further technical advantage is an improvement in program/erase efficiency. The cell has more programming area, i.e., more of a floating gate/drain overlap during programming operations, and more of a source region overlap which is important in erase operations.

Yet a further technical advantage is that the cell of the invention is more scalable. Because the channel length is not controlled by photolithography, the channel length is not limited in minimum size by the minimum photolithographic feature dimension L. Further, the lateral cell dimension is not limited by punch-through leakage considerations. Cell optimization is therefore decoupled from the channel length because the channel is more vertical.

A further technical advantage is that the present invention incorporates a trench isolation technique into a nonvolatile cell array without tunnel oxide degradation. Because of the high electric fields generated in using these devices, their performance and quality control is highly dependent upon the quality of the tunnel oxide layer across which such electric fields are experienced.

While preferred embodiments of the invention have been described in the above detailed description and illustrated in the accompanying drawings, the invention is not limited thereto but only by the scope and spirit of the appended claims.

What is claimed is:

1. A pair of nonvolatile memory cells formed at a face of a semiconductor layer having a first conductivity type, comprising:

a first region formed in said semiconductor layer to be of a second conductivity type opposite said first conductivity type, a boundary of said first region spaced from said face;

a second region formed in said semiconductor layer to be of said first conductivity type, said second region interposed between said first region and said face of said semiconductor layer;

a hole formed in said semiconductor layer from said face through said second region to intersect said first region, said hole having sidewalls;

a tunnel dielectric layer formed on said sidewalls of said hole;

first and second conductive floating gates formed in said hole to be insulatively spaced from one another, said first region and said second region, said floating gates having respective top surfaces;

respective first and second control gate dielectric layers formed on said top surfaces of said first and second floating gates;

a first conductive control gate formed on said first control gate dielectric layer, a second conductive control gate formed on said second control gate dielectric layer wherein the first and second conductive control gates formed the hole; and a drain region formed to be of said second conductivity type, to be adjacent said face of said semiconductor layer, to be spaced from said first region, and to be insulatively adjacent said first floating gate and said second floating gate.

2. The memory cells of claim 1, wherein a thick insulator layer is disposed between said first floating gate and said second floating gate, a thickness of said thick insulator layer being such that the capacitive coupling between said first floating gate and said second floating gate is minimized.

3. The memory cells of claim 1, wherein a thick insulator layer is disposed between said first floating gate and said second floating gate, a thickness of said thick insulator layer being substantially the same as the minimum lithographic feature dimension L.

4. The memory cells of claim 1, wherein said sidewalls of said hole include a first sidewall and a second sidewall spaced from said first sidewall, said first floating gate disposed adjacent said first sidewall, said second floating gate disposed adjacent said second sidewall.

5. The memory cells of claim 1, wherein said sidewalls are sloped relative to said face.

6. The memory cells of claim 5, wherein said hole has a center, first and third sidewalls in opposition to each other and sloping from said face of said semiconductor layer inward toward said center, second and fourth sidewalls joining said first and third sidewalls, said second and fourth sidewalls being spaced from each other, said first floating gate disposed adjacent said first, second and fourth sidewalls, said second floating gate disposed adjacent said third, second and fourth sidewalls.

7. The memory cells of claim 1, wherein said hole is U-shaped after formation of said tunnel dielectric layer.

8. The memory cells of claim 1, wherein said semiconductor layer has a 1-0-0 crystallography relative to said face thereof.

9. The memory cells of claim 1, wherein said tunnel dielectric layer is formed from a material selected from the group consisting of oxide, nitrided oxide and oxide/nitride/oxide.

10. The memory cells of claim 1, wherein said control gate dielectric layers are formed from a material selected from the group consisting of oxide, nitrided oxide and oxide/nitride/oxide.

11. The memory cells of claim 1, wherein said first conductivity type is (p).

12. The memory cells of claim 1, wherein said first region is formed from a deep implant of dopant of said second conductivity type.

13. The memory cells of claim 1, wherein said cells are electrically erasable and programmable read-only memory (EEPROM) cells.

14. A pair of nonvolatile memory cells formed at a face of a semiconductor layer having a first conductivity type, comprising:
 a first region formed in said semiconductor layer to be of a second conductivity type opposite said first conductivity type, a boundary of said first region spaced from said face;
 a second region formed in said semiconductor layer to be of said first conductivity type, said second region interposed between said first region and said face of said semiconductor layer;
 a hole formed in said semiconductor layer from said face through said second region to intersect said first region, said hole having sidewalls;
 a tunnel dielectric layer formed on said sidewalls of said hole;
 first and second conductive floating gates formed in said hole to be insulatively spaced from one another, said first region and said second region, said floating gates having respective top surfaces;
 respective first and second control gate dielectric layers formed on said top surfaces of said first and second floating gates;
 a first conductive control gate formed on said first control gate dielectric layer, a second conductive control gate formed on said second control gate dielectric layer wherein the first and second conductive control gates formed outside the hole;
 a first drain region formed to be of said second conductivity type, to be adjacent said face of said semiconductor layer, to be spaced from said first region, and to be insulatively adjacent said first floating gate; and
 a second drain region formed to be of said second conductivity type, to be adjacent said face of said semiconductor layer, to be spaced from said second region, and to be insulatively adjacent said second floating gate.

15. The memory cells of claim 14, wherein said first drain region is integral with said second drain region.

16. The memory cells of claim 14, wherein said control gate dielectric layers are selected from the group consisting of oxide, nitrided oxide and oxide/nitride/oxide.

17. An array of nonvolatile memory cells formed at a face of a semiconductor layer having a first conductivity type, comprising:
 a heavily doped region formed to be of a second conductivity type opposite said first conductivity type, a boundary of said heavily doped region spaced from said face of said semiconductor layer;
 a plurality of holes formed from said face of said semiconductor layer to intersect said heavily doped region, each of said holes having sidewalls, said holes formed to be spaced apart from each other in rows aligned in a first direction and also in columns aligned in a second direction at an angle to said first direction;
 for each hole, a tunnel dielectric layer formed on the sidewalls thereof, at least first and second conductive floating gates formed in the last said hole to adjoin said tunnel dielectric layer, said first and second floating gates insulatively spaced from each other, each said floating gate having a top surface, a first control gate dielectric layer formed on said top surface of said first floating gate, a second control gate dielectric layer formed on said top surface of said second floating gate;
 a plurality of drain regions formed to be adjacent said face of said semiconductor layer, each of said drain regions formed to be adjacent at least one of said holes, said drain regions formed to be of said second conductivity type, each column of said drain regions connected by a respective bit line; and
 for each row, first and second continuous conductive word lines, said first word line formed on said first control gate dielectric layers in said row, said second word line formed on said second control gate dielectric layers in said row wherein the first and second word lines formed outside the hole.

18. The array of claim 17, wherein, for each hole, said first floating gate and said second floating gate are substantially capacitively decoupled from each other by a thick insulator layer.

19. The array of claim 18, wherein a thickness of said thick insulator layer is substantially the same as the lithographic minimum resolution dimension L.

20. The array of claim 17, wherein said first direction is at right angles to said second direction.

21. The array of claim 17, wherein said first and second word lines comprise polycrystalline silicon.

22. The array of claim 17, wherein said first and second word lines include tungsten silicide.

23. The array of claim 17, wherein said semiconductor layer has a 1-0-0 crystallography relative to said face thereof.

24. The array of claim 17, wherein each said drain region laterally surrounds at least one of said holes.

25. The array of claim 17, and further comprising, for each hole, an implanted punch-through prevention region adjacent the sidewalls thereof.

26. The array of claim 15, and further comprising, for each hole, an implanted threshold voltage adjust region formed adjacent the sidewalls thereof.

* * * * *